United States Patent
Fuchs et al.

(10) Patent No.: US 6,936,304 B2
(45) Date of Patent: Aug. 30, 2005

(54) METHOD FOR PRODUCING A LUMINOPHORE OR FLUORESCENT LAYER

(75) Inventors: Manfred Fuchs, Nürnberg (DE); Erich Hell, Erlangen (DE); Detlef Mattern, Erlangen (DE); Bernhard Schmitt, Erlangen (DE)

(73) Assignee: Agfa-Gevaert (BE)

( * ) Notice: Subject to any disclaimer, the term of this patent is extended or adjusted under 35 U.S.C. 154(b) by 1 day.

(21) Appl. No.: 10/363,598

(22) PCT Filed: Sep. 8, 2001

(86) PCT No.: PCT/DE01/03435
§ 371 (c)(1),
(2), (4) Date: Jul. 1, 2003

(87) PCT Pub. No.: WO02/20868
PCT Pub. Date: Mar. 14, 2002

(65) Prior Publication Data
US 2004/0013798 A1 Jan. 22, 2004

(30) Foreign Application Priority Data
Sep. 8, 2000 (DE) .......................................... 100 44 425

(51) Int. Cl.⁷ ................................................ B05D 5/12
(52) U.S. Cl. ......................... 427/157; 427/64; 427/162
(58) Field of Search ......................... 427/64, 157, 162, 427/58

(56) References Cited

U.S. PATENT DOCUMENTS

| | | | | |
|---|---|---|---|---|
| 3,649,328 A | | 3/1972 | Neis | |
| 4,692,813 A | * | 9/1987 | Conrad et al. | 358/406 |
| 5,536,999 A | * | 7/1996 | Winsor | 313/493 |
| 5,846,854 A | * | 12/1998 | Giraud et al. | 438/149 |
| 6,015,587 A | | 1/2000 | Fran et al. | |
| 6,597,108 B2 | * | 7/2003 | Yano et al. | 313/503 |
| 6,614,173 B2 | * | 9/2003 | Yano et al. | 313/503 |
| 6,720,026 B2 | * | 4/2004 | Fuchs et al. | 427/65 |

FOREIGN PATENT DOCUMENTS

| | | |
|---|---|---|
| DE | 2 137 392 | 2/1973 |
| DE | 24 35 629 | 2/1976 |
| DE | 28 32 141 | 1/1980 |
| DE | 44 29 013 | 2/1996 |
| DE | 195 16 450 | 8/1996 |
| DE | 198 52 326 | 11/1999 |
| EP | 0 042 149 | 3/1987 |
| EP | 0 331 019 | 9/1989 |

OTHER PUBLICATIONS

Schubert, "Preparation of Self–Supporting Large–Area Polycrystalline Structures of CsI(Na) by Evaporation", *Siemens Forsch.–u. Entwickl.–Ber.*, vol. 3, No. 2 (1974), pp. 100–102.

* cited by examiner

Primary Examiner—Bret Chen
(74) Attorney, Agent, or Firm—Schiff Hardin LLP

(57) ABSTRACT

A method for producing a coating of fluorescent or luminophore material includes the steps of depositing the luminophore material from a vapor phase on a substrate in such a manner that at least 30 weight-% of the luminophore material used is deposited on the substrate and then abrading or polishing the luminophore coating to a predetermined even layer thickness utilizing a polishing agent.

16 Claims, 1 Drawing Sheet

METHOD FOR PRODUCING A LUMINOPHORE OR FLUORESCENT LAYER

BACKGROUND OF THE INVENTION

The invention is directed to a method for producing a luminophore layer.

DE 195 16 450 C1 discloses a method for producing a luminiferous layer composed of CsI:Tl. It is thereby provided that the pressure in the vapor-deposition system is higher than the vapor pressure of the thallium iodide, at least during the vapor-deposition. A luminophore layer whose light yield is improved can be produced based on this method.

An experimental method for producing a luminophore layer composed of CsI(Na) is also known from "preparation of Self-Supporting Large-Area Polycrystalline Structures of CsI(Na) by Evaporation", W. Schubert, Siemens Forsch.- und Entwickl.-Ber., Vol. 3 (1974), No. 2, Springer Verlag, 1974. A vapor-deposition rate of 65 weight-% of the utilized material is thereby achieved.

DE 198 52 326 A1 discloses a method that is particularly suited for coating a substrate with GaBr-doped luminophores. The luminophore is thereby placed onto a heated evaporation source in a vacuum in the vapor-deposition chamber, said luminophore immediately vaporizing thereat and depositing on the substrate.

DE 44 29 013 A1 discloses an apparatus for the vapor-deposition of a substrate having an X-ray measuring instrument for measuring the layer thickness. The vapor-deposition rate is regulated dependent on the measured result of the layer thickness measurement in order to achieve an optimally uniform layer thickness.

DE 24 35 629 A1 discloses a method for smoothing the surface of a luminophore layer applied on a substrate. The surface is thereby worked with forging bodies in the fashion of forging.

DE 28 32 141 A1 discloses a method for manufacturing radiation converter screens, whereby a luminophore layer applied on a substrate is ground and polished for achieving a uniform layer thickness. Irregularities that project above the luminophore layer are thereby in fact eliminated. However, relatively long-wave irregularities are generated when grinding and polishing. Moreover, relatively large grinding agent grains are worked into the luminophore layer during grinding. These reduce the optical quality of the luminophore layer.

In order to counter this disadvantage, attempts have already been made in the Prior Art to arrange the luminophore source at as great a distance as possible from the substrate during the vapor-deposition. Luminophore layers deposited in this way are relatively uniform in terms of their layer thickness. However, a great deal of material must be utilized here during the vapor-deposition because only about 10 weight-% of the evaporated material are deposited on the substrate here.

SUMMARY OF THE INVENTION

An object of the invention is to eliminate the disadvantages of the Prior Art. In particular, a method should be specified with which a luminophore layer or fluorescent layer having an optimally uniform layer thickness can be manufactured in an optimally simple way.

This object is achieved by a method for producing a luminophore layer comprising the following steps:

a) depositing of the luminophore from the vapor phase on a substrate such that the spacing of the luminophore source from the substrate is selected such that at least 30 weight-% of the utilized luminophore are deposited on the substrate; and b) abrasively eroding of the luminophore layer to a prescribed, uniform layer thickness by means of a polishing agent.

The economic feasibility of the method is enhanced in that at least 30 weight-% of the utilized luminophore are deposited on the substrate. A uniform layer thickness can then be achieved by means of a following, abrasive erosion of the luminophore layer with a polishing agent.

Expediently, the substrate is rotated during step a). A sponge or felt manufactured of plastic is advantageously employed as the polishing agent. Powdered luminophore can be contained in the sponge or felt. Expediently, this is the same luminophore that has been deposited on the substrate. Doped alkali halides such as, for example, CsI:Na, CsI:Tl or CsBr:Eu particularly come into consideration as the luminophore. What the inclusion of the powdered luminophore in the sponge or felt during the abrasive erosion achieves is that fissures in the luminophore layer are filled out with the powdered luminophore.

The abrasive erosion can be implemented by means of a nonaqueous liquid, preferably, ethanol, silicone oil or cyclohexane.

Corundum or diamond particles can be added to the liquid. The rate of the erosive abrasion can thus be increased.

According to another design feature, the layer thickness distribution of the deposited luminophore layer can be measured topically resolved before step b), and the corresponding data can be stored. For the implementation of such a topically resolved measurement, the luminophore layer deposited on the surface of the substrate can be measured with a probe of a CNC measuring machine or with an optical method such as, for example, oblique light laser interferometry. Measuring the layer thickness by means of X-ray absorption measurement also comes into consideration. A pressing power whose size is inversely proportional to the measured layer thickness can be applied onto the polishing agent. For example, the pressing power on the polishing agent is increased where the layer thickness is high. Further, the relative speed of the substrate relative to the polishing agent can be inversely proportional to the measured layer thickness. For example, the rotational or, respectively, circumferential speed of the substrate is especially high at locations where the measured layer thickness is low, and it is low where the measured layer thickness is high. The above-described method for abrasive erosion is expediently implemented using a computer-assisted mechanism that uses the measured data. The polishing agent, for example, can be radially moved over the rotating substrate.

An exemplary embodiment of the inventive method is explained in greater detail below on the basis of the drawing.

DESCRIPTION OF THE PREFERRED EMBODIMENTS

For producing a luminophore layer for a radiation converter screen, a substrate manufactured, for example, of a planar aluminum disk is introduced into a known vapor-deposition system. Such a vapor-deposition system is known, for example, from DE 195 16 450 C1, whose disclosure is herewith incorporated. The temperature of the substrate is set such that the saturation vapor pressure over the luminophore layer condensing on the substrate is lower than the vacuum prevailing in the vapor-deposition. A luminophore layer having a thickness of approximately 500 $\mu$m is vapor-deposited. The spacing between the source of the luminophore to be evaporated and the substrate is thereby selected such that at least 30 weight-%, and preferably 50 weight-%, of the evaporated luminophore precipitate on the substrate.

Figure 1:
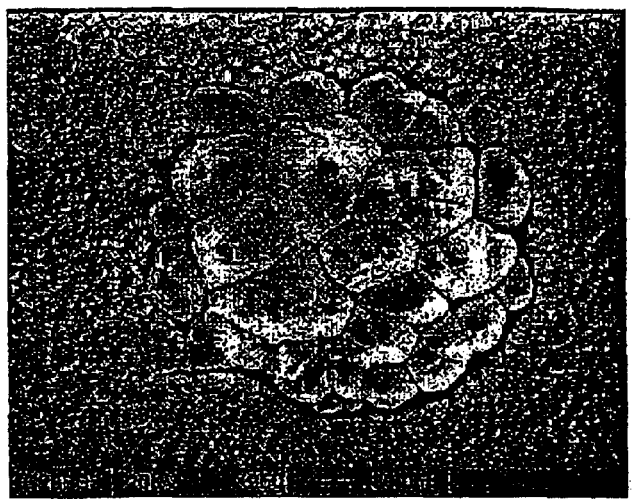
FIG. 1 is a picture of an inhomogeneity in a luminophore layer, which picture was made with a scanning electron microscope.
Figure 2:
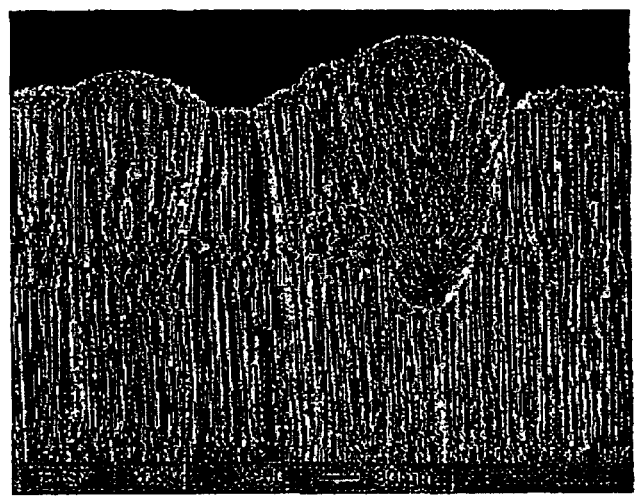
FIG. 2 is a picture of a fracture edge of a luminophore layer through an inhomogeneity, which picture was made with a scanning electron microscope.

In particular, the vapor-deposited luminophore layer comprises the punctiform inhomogeneities shown in FIGS. 1 and 2, these being caused by a giant grain growth. In addition, a non-uniform layer thickness distribution on the substrate caused by the vapor-deposition can occur.

For producing a uniform layer thickness, the luminophore layer is reduced to a prescribed, uniform layer thickness by means of a polishing agent. A felt, preferably a plastic felt, or a polishing agent equipped with plastic bristles is expediently employed as the polishing agent. The polishing ensues wet, preferably with a non-aqueous liquid, for example ethanol, silicone oil or cyclohexane. Diamond particles can be added to the liquid. Luminophore particles can be contained in the polishing agent in order to fill fissures that may potentially be present at the surface of the luminophore layer. To that end, the polishing agent is expediently placed into a saturated aqueous solution of the luminophore to be polished and is subsequently dried.

The measurement of the layer thickness of the luminophore layer applied onto the substrate ensues, for example, with the probe of a CNC measuring machine, an optical method such as, for example, oblique light laser interferometry or by means of X-ray absorption measurements.

The data acquired in the layer thickness measurement are made available to a polishing device that works according to the zonal correction principle. Such a polishing device is available, for example, from JenOptik AG under the name "Feinkorrekturmaschine FK 300". With such a polishing device, a low circumferential speed of the substrate and—at the same time—a high pressing power onto the substrate can be set at locations of the high layer thickness. A higher circumferential speed and a lower pressing power can be set given a low layer thickness. The control of the circumferential speed, of the pressing power and the radial position of the polishing or grinding agent relative to the rotating substrate ensues automatically, preferably it is computer-assisted.

The inventive method succeeds in setting the layer thickness of the luminophore layer with a deviation of less than 2%. In the case of a luminophore layer produced, for example, of CsBr:Eu, this corresponds to a maximum layer thickness deviation of less than 10 $\mu$m.

Figure 3:
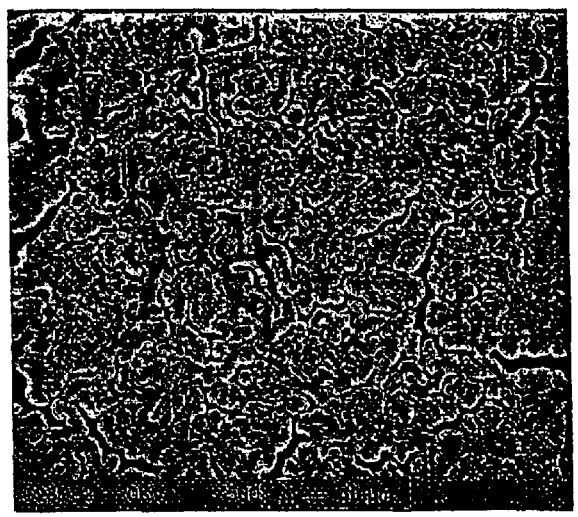
FIG. 3 is a picture onto the surface of a luminophore layer, which picture was made with a scanning electron microscope.

Another advantage of the inventive method is that fissures located at the surface of the luminophore layer, as shown, for example, in FIG. 3, are simultaneously closed by the luminophore particles contained in the polishing agent.

We claim:

1. A method for producing a luminophore layer comprising the steps of depositing a luminophore from a vapor phase on a substrate, so that at least 30 weight-% of the utilized luminophore is deposited on the substrate; and using a polishing agent to abrasively erode the luminophore layer to a prescribed uniform layer thickness and to fill the fissures on the luminophore layer.

2. A method according to claim 1, which includes, prior to abrasively eroding, topically measuring the layer thickness of the deposited luminophore layer and recording this data.

3. A method according to claim 2, wherein the step of abrasively eroding includes applying a pressing power to the polishing agent, which is inversely proportional to the measured layer thickness.

4. A method according to claim 2, which includes a relative rotation of the substrate to the polishing agent, and adjusting the speed of the relative rotation proportional to the measured layer thickness.

5. A method according to claim 2, wherein the step of abrasively eroding is implemented by computer-assisted employment of the measured data.

6. A method according to claim 1, wherein the polishing agent is selected from a sponge and felt manufactured of plastic.

7. A method according to claim 6, wherein powder luminophore is contained in the polishing agent.

8. A method according to claim 1, wherein the abrasive eroding is implemented by means of a non-aqueous liquid.

9. A method according to claim 8, wherein the liquid is selected from a group consisting of ethanol, silicone oil and cyclohexane.

10. A method according to claim 8, wherein the liquid contains particles selected from corundum particles and diamond particles.

11. A method for producing a luminophore layer comprising the steps of depositing a luminophore from a vapor phase on a substrate, so that at lest 30 weight % of the utilized luminophore is deposited on the substrate; rotating the substrate during the step of depositing; and abrasively eroding the luminophore layer to a prescribed uniform layer thickness by using a polishing agent.

12. A method according to claim 11, wherein the step of abrasively eroding utilizes a polishing agent selected from a sponge and felt manufactured of plastic.

13. A method according to claim 12, wherein powder luminophores are contained in said polishing agent.

14. A method according to claim 13, wherein the step of abrasively eroding includes applying a non-aqueous liquid.

15. A method according to claim 14, wherein the non-aqueous liquid is selected from a group consisting of ethanol, silicone oil and cyclohexane.

16. A method according to claim 14, wherein particles selected from corundum and diamond particles are added to the liquid.

* * * * *